US011195576B2

(12) United States Patent
Kumar et al.

(10) Patent No.: US 11,195,576 B2
(45) Date of Patent: Dec. 7, 2021

(54) ROBUST ADAPTIVE METHOD AND CIRCUIT FOR CONTROLLING A TIMING WINDOW FOR ENABLING OPERATION OF SENSE AMPLIFIER

(71) Applicant: STMicroelectronics International N.V., Schiphol (NL)

(72) Inventors: Shishir Kumar, Greater Noida (IN); Bhupender Singh, Palam (IN)

(73) Assignee: STMicroelectronics International N.V., Schiphol (NL)

( * ) Notice: Subject to any disclaimer, the term of this patent is extended or adjusted under 35 U.S.C. 154(b) by 49 days.

(21) Appl. No.: 16/596,989

(22) Filed: Oct. 9, 2019

(65) Prior Publication Data

US 2020/0118617 A1 Apr. 16, 2020

Related U.S. Application Data

(60) Provisional application No. 62/744,748, filed on Oct. 12, 2018.

(51) Int. Cl.
*G11C 11/419* (2006.01)
*G11C 11/417* (2006.01)

(52) U.S. Cl.
CPC .......... *G11C 11/419* (2013.01); *G11C 11/417* (2013.01)

(58) Field of Classification Search
CPC ........... G11C 7/06; G11C 7/062; G11C 7/065; G11C 7/067; G11C 7/08; G11C 7/22; G11C 7/222
See application file for complete search history.

(56) References Cited

U.S. PATENT DOCUMENTS

| 8,830,766 B2 | 9/2014 | Sahu | |
|---|---|---|---|
| 2009/0045849 A1* | 2/2009 | Kim | G11C 7/1069 327/55 |
| 2013/0258794 A1* | 10/2013 | Sharad | G11C 7/08 365/205 |

* cited by examiner

Primary Examiner — Alfredo Bermudez Lozada
(74) Attorney, Agent, or Firm — Crowe & Dunlevy

(57) ABSTRACT

A sense amplifier enable signal and a tracking signal are generated in response to an indication that a sufficient voltage difference has developed across bit lines of a memory. The sense amplifier enable signal has a pulse width between a leading edge and a trailing edge. The sense amplifier enable signal is propagated along a first U-turn signal line that extends parallel to rows of the memory array and is coupled to sense amplifiers arranged in a row to generate a sense amplifier enable return signal. The tracking signal is propagated along a second U-turn signal line extending parallel to columns of the memory array to generate a tracking return signal. The sense amplifier enable return signal and the tracking return signal are logically combined to generate a reset signal. Timing of the trailing edge of the pulse width is controlled by the reset signal.

20 Claims, 5 Drawing Sheets

US 11,195,576 B2

ROBUST ADAPTIVE METHOD AND CIRCUIT FOR CONTROLLING A TIMING WINDOW FOR ENABLING OPERATION OF SENSE AMPLIFIER

PRIORITY CLAIM

This application claims the priority benefit of U.S. Provisional Application for Patent No. 62/744,748, filed on Oct. 12, 2018, the content of which is hereby incorporated by reference in its entirety to the maximum extent allowable by law.

TECHNICAL FIELD

The present invention relates generally to sense amplifier control circuits and, in particular, to a circuit which controls the timing window (pulse width) for enabling sense amplifier operation within a memory and/or memory compiler.

BACKGROUND

A memory circuit is formed by an array of memory cells arranged in rows and columns along with a plurality of sense amplifiers that are selectively coupled to columns of the array. The proper operation of the memory is dependent on the timing window for enabling operation of the sense amplifiers. The sense amplifiers must be enabled for operation when a sufficient voltage differential is developed on the bit lines of each selected column in order to read data stored in the memory cells. Additionally, the sense amplifiers must be disabled following the latching of the read data with a safe margin across process, voltage and temperature (PVT) variations. In effect, it is the pulse width of the sense amplifier enable (SAEN) signal that must be controlled. Generally speaking, the timing for triggering on of the SAEN signal (i.e., the leading edge of the SAEN pulse) can be managed through a scheme such as bit line tracking which is tuned to enable the sense amplifier when a sufficient voltage difference is present at the differential input nodes of the sense amplifier in order to ensure proper resolution and a successful latching of the read data. The timing for triggering off of the SAEN signal (i.e., the trailing edge of the SAEN pulse), however, is more difficult to control in a way which balances successfully latching the read data against penalizing the cycle time for completing the data read. In many prior art memories, the circuit for controlling the timing for triggering off of the SAEN signal is engineered to account for a worst case scenario at the expense of accepting a delay in cycle time. Operation of the sense amplifiers is therefore not optimized. Additionally, in memory compilers this becomes more complex as it supports a range of rows and columns where it is required to tune the triggering off of the SAEN signal as per the worst cut size, which then penalizes the cycle time for smaller cuts.

FIG. 1A shows a circuit diagram for a prior art circuit 10 for generating the SAEN signal. The circuit 10 includes an n-channel metal oxide semiconductor field effect transistor (MOSFET) 18 having a gate terminal coupled to an input 12 and a source terminal coupled to a reference supply node (for example, ground). A p-channel MOSFET 22 had its source-drain path connected in series with the source-drain path of transistor 18. More specifically, the drain terminal of transistor 22 is connected to the drain terminal of transistor 18 at node 26. The source terminal of transistor 22 is coupled to a power supply node (Vdd). The gate terminal of transistor 22 is coupled to receive a reset signal RESET. A latch circuit 30 is connected to node 26. The latch circuit 30 may, for example, be formed by a pair of cross-coupled complementary metal oxide semiconductor (CMOS) logic inverter circuits. A first CMOS inverter circuit 34 has an input connected to node 26. A second CMOS inverter circuit 36 has an input connected to the output of the first inverter circuit 34. The SAEN signal is generated at the output of the inverter circuit 36. The output of the inverter circuit 36 is further connected to the input of a tunable delay circuit 40 which applies a tunable delay time period td to the received SAEN signal. The output of the tunable delay circuit 40 generates the reset signal RESET. The tunable delay 40 is tuned as per the worst case requirement of the SAEN pulse width. The pulse width essentially should be more than the addition of a sense amplifier resolution time and the time taken for the output of the sense amplifier to settle on the global output lines and also to latch in the output latch.

Operation of the circuit 10 for generating the SAEN signal is as follows (see, also, FIG. 1B): The circuit 10 receives at the input 12 a control signal CTRL whose logic state transitions from logic low (logic "0") to logic high (logic "1") in response to a tracking circuit 14 determining that data on the bit lines of the memory array is ready to be read. The tracking circuit 14 may, for example, comprise a dummy bit line tracking circuit which ensures a sufficient voltage difference is present on the actual bit lines so that the sense amplifier can ensure a successful resolution of the voltages and the read data can be latched. In response to the logic high state of the control signal CTRL, the transistor 18 turns on and drives node 26 to the logic low state. This logic low state is latched by the latch circuit 30. The SAEN signal output from inverter circuit 36 is likewise driven to the logic low state after a small delay introduced by the operation of inverters 34 and 36. The transition to logic low is the leading edge 44 of the pulse for the SAEN signal. A sense amplifier circuit 48 includes a sense amplifier 48a that is enabled for operation by the logic low state of the SAEN signal. When enabled, the sense amplifier 48a resolves the voltage difference between the bit lines (BL/BLB) and generates an output which settles on the global output line 130 and is latched by output latch 48b as a global output signal. The tunable delay circuit 40 receives the SAEN signal and delays the transition to the logic low state of the reset signal RESET by the tunable delay time period td. In response to the transition of the reset signal RESET to the logic low state, the transistor 22 turns on and pulls node 26 to the logic high state (Vdd). This logic high state is latched by the latch circuit 30. The SAEN signal output from inverter circuit 36 is likewise driven to the logic high state after a small delay introduced by the operation of inverters 34 and 36. The transition to logic high is the trailing edge 46 of the pulse for the SAEN signal. The pulse width PW of the pulse for the SAEN signal (i.e., from leading edge 44 to trailing edge 46) is accordingly controlled by the length of the tunable delay time period td.

FIG. 2 shows a simplified block diagram of an integrated circuit of a bank architecture based memory 100. The memory includes a first (top) memory bank 112t and a second (bottom) memory bank 112b. Each memory bank 112 includes an array of memory cells (C) 114 arranged in rows and columns, where rows are associated with word lines 116 and columns are associated bit lines 118. The memory cells 114 may, for example, be static random access memory (SRAM) cells. The word lines 116 for the first (top) memory core 112t are selectively driven by a first (top) row decoder 120t. The word lines 116 for the second (bottom) memory core 112b are selectively driven by a second (bottom) row decoder 120b. The row decoders 120 receive a memory address on an address bus 122 and decode the received address bits (or a subset thereof) of the memory address to make a selection of a memory bank 112 and one of the word lines 116 within that selected memory bank for actuation (for example, to be driven logic high). The memory 100 further includes a column decoder and sense amplifier circuit (COL DEC and SA) 124 that is also coupled to the address bus 122 as well as to the bit lines 118 from both the first (top) memory core 112t and the second (bottom) memory core 112b. The column decoder and sense amplifier circuit 124 also receives the memory address from the address bus 122 and decodes the received address bits (or a subset thereof) of the memory address to select a plurality of bit lines 118 to be coupled to corresponding ones of a plurality of sense amplifier circuits (not explicitly shown, see FIG. 3, reference 48, where each sense amplifier circuit 48 includes a sense amplifier 48a coupled to a latch circuit 48b is configured to hold the output on line 130 when the sense amplifier 48a is reset). An input/output (I/O) circuit 128 is coupled to receive the output of the sense amplifier circuits within the column decoder and sense amplifier circuit 124 over global output lines 130.

With reference to FIG. 3, details of the sense amplifier portion of the column decoder and sense amplifier circuit 124 are shown. The column decoder functionality of the column decoder and sense amplifier circuit 124 is omitted so that attention can be focused on the sense amplifier portion. The column decoders would be provided between the plurality of sense amplifiers and each of the memory banks 112. The sense amplifier circuit portion includes a SAEN generator circuit 10 (for example, of the type shown in FIG. 1A) that is configured to generate the SAEN signal which is applied to each of the sense amplifier circuits 48 (and in particular to the sense amplifiers 48a therein) over SAEN signal line 140. The SAEN signal line 140 extends through (or passes by) each of the sense amplifiers 48a of the plurality of sense amplifier circuit 48 within the column decoder and sense amplifier circuit 124.

In read mode, a memory address is applied to the address bus 122, with the bits of the memory address specifying the location within the memory banks 112 from where the data is to be retrieved. The row decoder 120 and column decoder 124 decode the received address bits of the memory address and select the memory bank 112, the word line 116 and the bit lines 118 within the selected memory bank for that memory address. The tracking circuit 14 then determines that a sufficient voltage difference is present on the bit lines 118 so that the sense amplifiers 48a can resolve the voltage difference, write the output on output lines 130 and ensure a successful latching of the read data in the output latches 48b. The control signal CTRL is asserted to the logic high state by the tracking circuit 14 and the SAEN signal is driven to the logic low state to enable operation of all of the sense amplifiers 48a through the SAEN signal line 140. The read data which is generated by the sense amplifiers 48a and latched by the output latches 48b is output to the input/output (I/O) circuit 128 over the global output lines 130. After the tunable delay time period td expires, the RESET signal is driven to the logic low state and this causes the SAEN signal to be driven to the logic high state. In response thereto, operation of the sense amplifiers 48a is disabled and the read operation ends.

SUMMARY

In an embodiment, a circuit comprises: a plurality of sense amplifiers arranged in a row, wherein each sense amplifier has an input coupled to a sense amplifier enable signal line that extends along the row from a first end on one end of the row of sense amplifiers to a second end on an opposite end of the row of sense amplifiers; a sense amplifier enable signal return line that extends from a third end at the opposite end of the row of sense amplifiers to a fourth end at the one end of the row of sense amplifiers; wherein the third end of the sense amplifier enable signal return line is coupled to the second end of the sense amplifier enable signal line; a sense amplifier enable signal generator circuit configured to apply a sense amplifier enable signal having a pulse width between a leading edge and a trailing edge to the first end of the sense amplifier enable signal line and receive a sense amplifier enable return signal at the fourth end of the sense amplifier enable signal return line, said sense amplifier enable return signal generated in response to the sense amplifier enable signal; and wherein timing of the trailing edge of the pulse width is set by the sense amplifier enable signal generator circuit in response to a change in logic state of said sense amplifier enable return signal.

In an embodiment, a circuit comprises: a first U-turn signal line extending parallel to rows of a memory array, said first U-turn signal line having an input configured to receive a sense amplifier enable signal and an output configured to output a sense amplifier enable return signal generated in response to the sense amplifier enable signal; a plurality of sense amplifiers arranged in a row and having inputs connected to receive the sense amplifier enable signal from the first U-turn signal line; a second U-turn signal line extending parallel to columns of the memory array, said second U-turn signal line having an input configured to receive a tracking signal and an output configured to output a tracking return signal generated in response to the tracking signal; a sense amplifier enable signal generator circuit configured to generate both the sense amplifier enable signal and the tracking signal, the sense amplifier enable signal having a pulse width between a leading edge and a trailing edge; and wherein timing of the trailing edge of the pulse width is set by a reset signal output by a logic circuit in response to a logical combination of the sense amplifier enable return signal and the tracking return signal.

In an embodiment, a method comprises: generating both a sense amplifier enable signal and a tracking signal in response to an indication that a sufficient voltage difference has developed across bit lines of a memory, wherein the sense amplifier enable signal has a pulse width between a leading edge and a trailing edge; propagating the sense amplifier enable signal through a first U-turn signal line extending parallel to rows of the memory array and coupled to a plurality of sense amplifiers arranged in a row to generate a sense amplifier enable return signal; propagating the tracking signal through a second U-turn signal line extending parallel to columns of the memory array to generate a tracking return signal; logically combining the sense amplifier enable return signal and the tracking return signal to generate a reset signal; and controlling timing of the trailing edge of the pulse width in response to said reset signal.

In an embodiment, a circuit comprises: a sense amplifier having an input coupled to a sense amplifier enable signal line, wherein the sense amplifier is connected to a pair of bit lines extending along a column; a tracking circuit configured to generate a tracking signal indicating a sufficient voltage difference is present on the pair of bit lines for sensing by the sense amplifier; a tracking signal line that extends along the column from a first end to a second end, said tracking signal being applied to the first end of the tracking signal line; a tracking signal return line that extends from a third end to a fourth end; wherein the third end of the tracking signal return line is coupled to the second end of the tracking signal line; a sense amplifier enable signal generator circuit configured to apply a sense amplifier enable signal to the sense amplifier enable signal line, said sense amplifier enable signal having a pulse width between a leading edge and a trailing edge, and wherein timing of the leading edge of the pulse width is set in response to said tracking signal, and receive a tracking return signal at the fourth end of the tracking signal return line, said tracking return signal generated in response to the tracking signal; and wherein timing of the trailing edge of the pulse width is set by the sense amplifier enable signal generator circuit in response to a change in logic state of said tracking return signal

BRIEF DESCRIPTION OF THE DRAWINGS

For a better understanding of the embodiments, reference will now be made by way of example only to the accompanying figures in which.

DETAILED DESCRIPTION

Figure 1A:
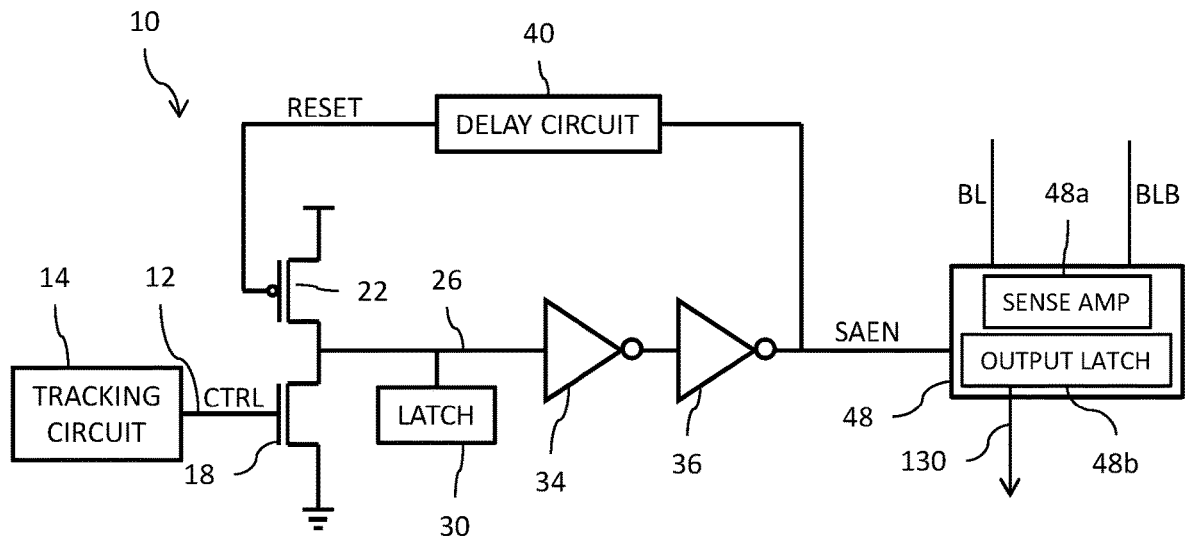
FIG. 1A shows a circuit diagram for a prior art circuit for generating a sense amplifier enable (SAEN) signal.
Figure 1B:
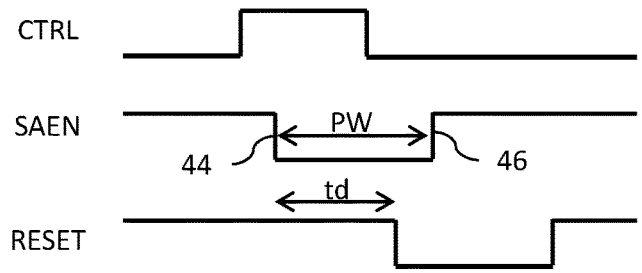
FIG. 1B shows a timing diagram for operation of the circuit of FIG. 1A.
Figure 3:
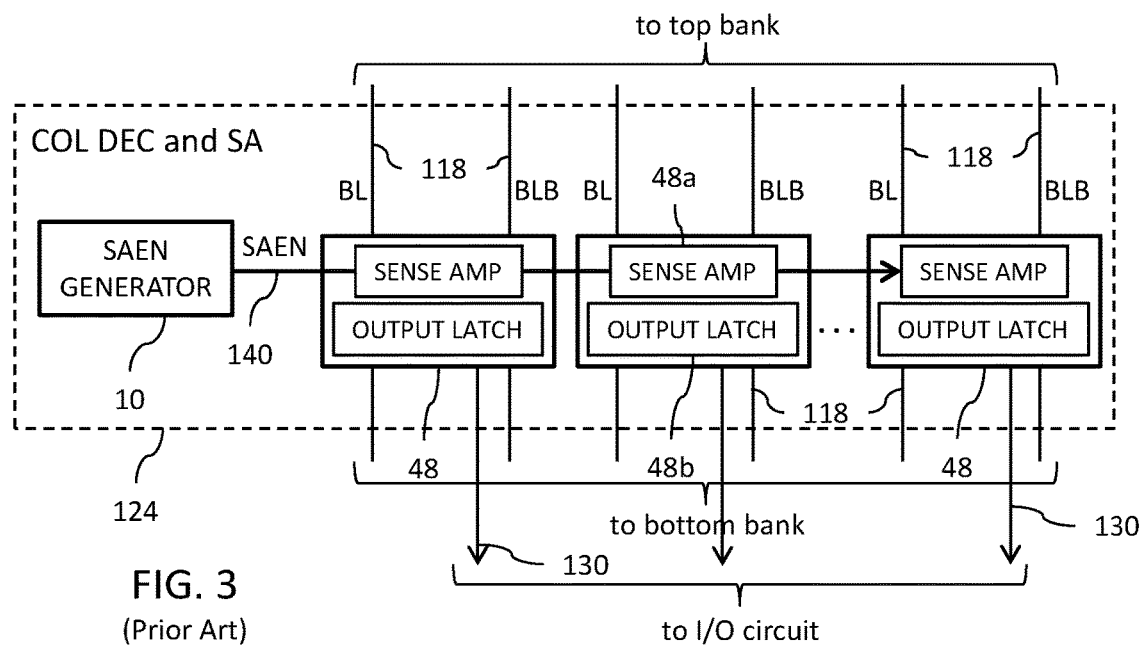
FIG. 3 is a simplified circuit example of a sense amplifier circuit portion within the memory of FIG. 2.
Figure 2:
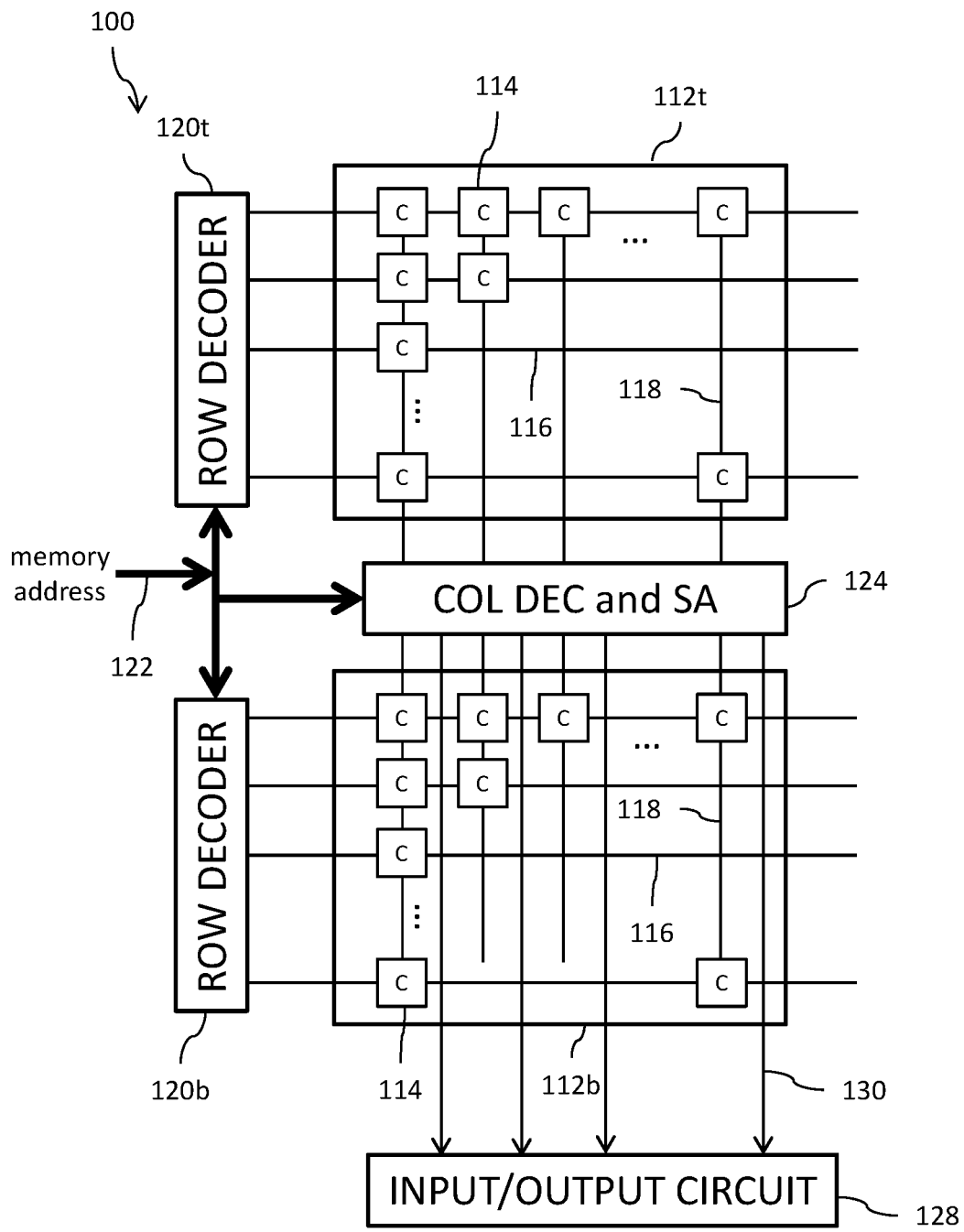
FIG. 2 is a block diagram of a memory.
Figure 4:
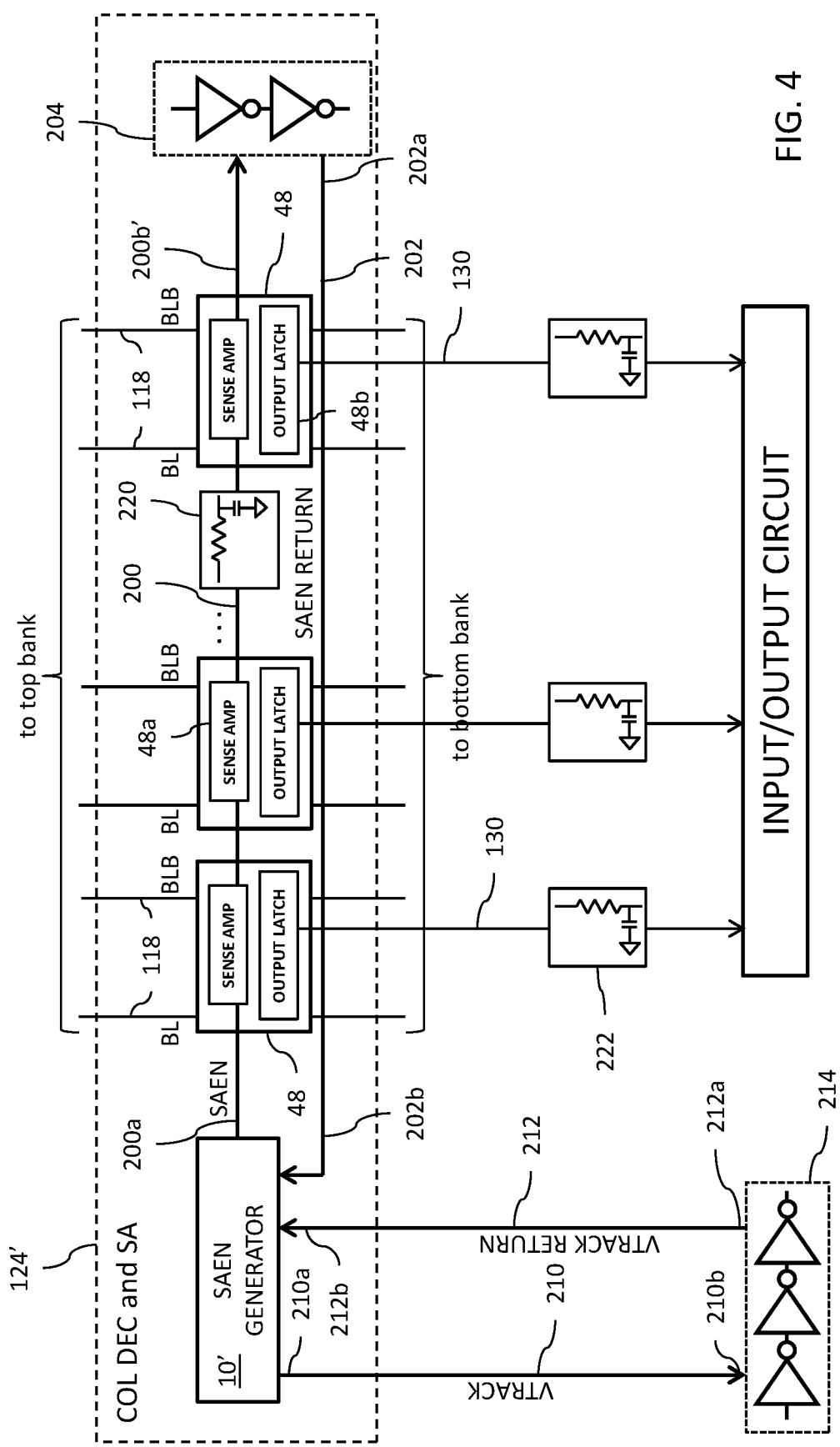
FIG. 4 is a simplified circuit example of a sense amplifier circuit portion within the memory of FIG. 2 along with tracking signals parallel to rows and columns.
Figure 5:
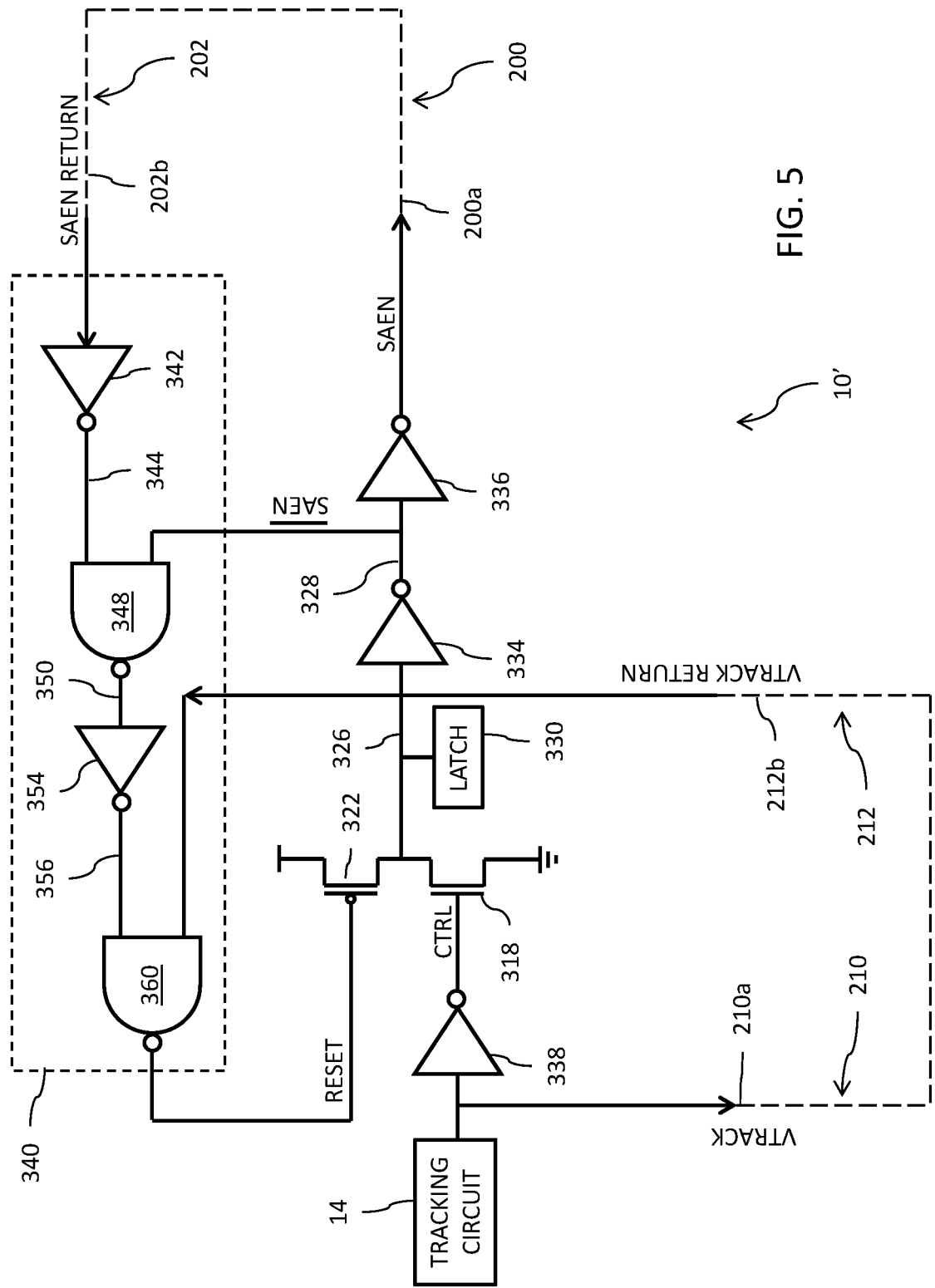
FIG. 5 is a circuit diagram of a circuit for generating the SAEN signal.

Reference is now made to FIG. 4 which shows a simplified circuit example of a sense amplifier circuit portion for use with the memory of FIG. 2. Like reference numbers refer to same or similar components as shown in FIG. 3. The sense amplifier circuit portion of FIG. 4 differs from the sense amplifier circuit portion of FIG. 3 in the use of a different SAEN generator circuit 10' (the details of which are shown in FIG. 5) and in the use of U-turn signal lines for the sense amplifier enable (SAEN) signal and a vertical tracking (VTRACK) signal.

The U-turn signal line for the SAEN signal comprises a SAEN signal line 200 and a SAEN signal return line 202. The SAEN signal line 200 extends from a first end 200a coupled at a first output of the SAEN generator circuit where the SAEN signal is generated and passes through or by, and is electrically connected to, each included sense amplifier 48a to a second end 200b. For sense amplifiers 48a that are arranged in a row, the SAEN signal line 200 extends from one end of the row to an opposite end of the row. The SAEN signal return line 202 extends in parallel to the SAEN signal line 200 from a first end 202a to a second end 202b coupled at a first input of the SAEN generator circuit. The second end 200b of the SAEN signal line 200 is coupled to the first end 202a of the SAEN signal return line 202 through a first driver circuit 204. The first driver circuit 204 is formed by a pair of series connected CMOS inverter circuits where the input of a first inverter circuit is coupled to the second end 200b and the output of a second inverter circuit is coupled to the first end 202a. With this configuration of the first driver circuit 204, the logic state of the SAEN RETURN signal on the SAEN signal return line 202 is the same logic state of the SAEN signal on the SAEN signal line 200. In an alternative embodiment, the first driver circuit 204 may instead be implemented with a non-inverting buffer circuit.

The U-turn signal line for the vertical tracking (VTRACK) signal comprises a tracking signal line 210 and a tracking signal return line 212. The tracking signal line 210 extends from a first end 210a coupled at a second output of the SAEN generator circuit and to a second end 210b such that a length of the tracking signal line 210 is substantially equal (i.e., same to within ±1-3%) to a length of each global output line 130. The tracking signal return line 212 extends in parallel to the tracking signal line 210 from a first end 212a to a second end 212b coupled at a second input of the SAEN generator circuit. The second end 210b of the tracking signal line 210 is coupled to the first end 212a of the tracking signal return line 212 through a second driver circuit 214. The second driver circuit 214 is formed by three series connected CMOS inverter circuits wherein the input of a first inverter circuit is coupled to the second end 210b and the output of a third inverter circuit is coupled to the first end 212a. With this configuration of the second driver circuit 214, the logic state of the VTRACK RETURN signal on the tracking signal return line 212 is the inverse logic state of the VTRACK signal on the tracking signal line 210. In alternative embodiment, the second driver circuit 214 may instead be implemented with a single logic inverter circuit.

It will be noted that SAEN signal line 200 and a SAEN signal return line 202 extend in the same direction (horizontally in the FIG. 3 illustration) as the word lines and the rows of memory cells within the memory banks. The change in logic state of the SAEN RETURN signal accordingly provides information concerning the time it takes for the SAEN signal to propagate from the SAEN generator circuit 10' horizontally past all of the sense amplifiers 48a and return back to the SAEN generator circuit 10'. This propagation time is affected by the RC delay of the SAEN signal line 200 (schematically represented by the RC circuit 220).

It will further be noted that the tracking signal line 210 and tracking signal return line 212 extend in the same direction (vertically in the FIG. 3 illustration) as the global output lines 130. The change in logic state of the VTRACK RETURN signal accordingly provides information concerning the time it takes for the VTRACK signal to propagate from the SAEN generator circuit 10' vertically to the input/output (I/O) circuit 128 and return back to the SAEN generator circuit 10'. This propagation time is affected by the RC delay of the tracking signal line 210 which effectively mimics the RC delay of the global output lines 130 (schematically represented by the RC circuit 222).

It will further be noted that in some memory configurations, the SAEN generator circuit 10' may be separate from the column decoder and sense amplifier circuit (COL DEC and SA) 124'.

Reference is now made to FIG. 5 which shows a circuit diagram of the SAEN generator circuit 10'. The circuit 10' includes an n-channel metal oxide semiconductor field effect transistor (MOSFET) 318 having a gate terminal coupled to receive a control signal CTRL and a source terminal coupled to a reference supply node (for example, ground). The control signal CTRL is generated by an inverter circuit 338 which receives the VTRACK signal that is generated by a tracking circuit 14 that functions to determine when data on the bit lines of the memory array is ready to be read. The VTRACK signal is further coupled to the first end 210*a* of the tracking signal line 210. A p-channel MOSFET 322 has its source-drain path connected in series with the source-drain path of transistor 318. More specifically, the drain terminal of transistor 322 is connected to the drain terminal of transistor 318 at node 326. The source terminal of transistor 322 is coupled to a power supply node (Vdd). The gate terminal of transistor 322 is coupled to receive a reset signal RESET. A latch circuit 330 is connected to node 326. The latch circuit 330 may, for example, be formed by a pair of cross-coupled complementary metal oxide semiconductor (CMOS) logic inverter circuits. A first CMOS inverter circuit 334 has an input connected to node 326 and an output connected to node 328. A second CMOS inverter circuit 336 has an input connected to node 328 and an output connected to the first end 200*a* of the SAEN signal line 200. The SAEN signal is generated at the output of inverter circuit 336.

The reset signal RESET is generated by a logic circuit 340 which logically combines the SAEN RETURN signal (received at the second end 202*b* of the SAEN signal return line 202), the logical inverse of the SAEN signal (received from node 328) and the VTRACK RETURN signal (received at the second end 212*b* of the tracking signal return line 212). The logic circuit 340 includes a logical inverter 342 having an inputs coupled to receive the SAEN RETURN signal and which generates a signal 344 having a logic state which is the inverse of the logic state of the SAEN RETURN signal. A logical NAND gate 348 has a first input that receives the signal 344 and a second input that receives the logical inverse of the SAEN signal (from node 328) and which generates a signal 350. The logical inverse of the SAEN signal (from node 328) functions as an enable control signal for enabling operation of the logic circuit 340. A logical inverter 354 receives the signal 350 and generates the signal 356. A logical NAND gate 360 has a first input that receives the signal 356 and a second input that receives the VTRACK RETURN signal and which generates the reset signal RESET.

Figure 6:
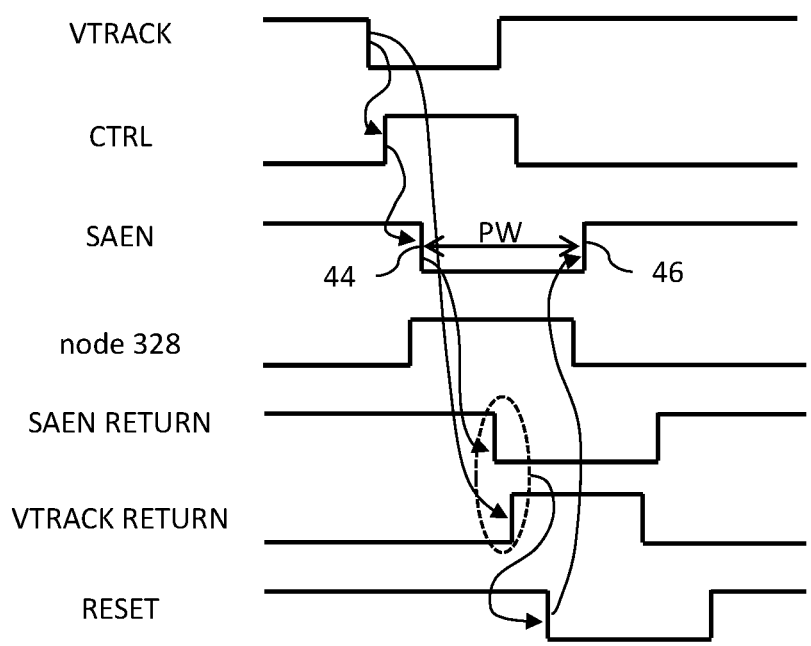
FIG. 6 shows a timing diagram for operation of the circuit of FIG. 5.

Operation of the circuit 10' (see, FIG. 5) for generating the SAEN signal is as follows (see, also, FIG. 6): The circuit 10 receives the VTRACK signal whose logic state transitions from logic high (logic "1") to logic low (logic "0") in response to the tracking circuit 14 determining that data on the bit lines of the memory array is ready to be read. This VTRACK signal is further coupled to the first end 210*a* of the tracking signal line 210. In response to the operation of the inverter 338, the logic state of the control signal CTRL transitions from logic low (logic "0") to logic high (logic "1"). In response to the logic high state of the control signal CTRL, the transistor 318 turns on and drives node 326 to the logic low state. This logic low state is latched by the latch circuit 330. The SAEN signal output from inverter circuit 336 at the first end 200*a* of the SAEN signal line 200 is likewise driven to the logic low state after a small delay introduced by the operation of inverters 334 and 336. The logical inverse of the SAEN signal is output at node 328 to enable operation of the logic circuit 340.

The transition to logic low of the SAEN signal is the leading edge 44 of the SAEN pulse. The plurality of sense amplifiers 48*a* are enabled for operation by the logic low state of the SAEN signal. When enabled, the sense amplifiers 48*a* resolve the data available on the bit lines (BL/BLB), write the output data on the global output lines 130 and latch the output data in the associated latches 48*b*.

The SAEN signal propagates over the U-turn signal line formed by SAEN signal line 200 and SAEN signal return line 202 to generate the SAEN RETURN signal. The VTRACK signal propagates over the U-turn signal line formed by tracking signal line 210 and tracking signal return line 212 to generate the VTRACK RETURN signal. The logic circuit 340, enabled for operation by the logic high state of the logical inverse of the SAEN signal from node 328, logically combines the SAEN RETURN signal and the VTRACK RETURN signal to generate the reset signal RESET. More specifically, in response to a logic low state of the SAEN RETURN signal and a logic high state of the VTRACK RETURN signal, the logic circuit 340 drives the reset signal RESET to a logic low state. In response to the transition of the reset signal RESET to the logic low state, the transistor 322 turns on and pulls node 326 to the logic high state (Vdd). This logic high state is latched by the latch circuit 330. The SAEN signal output from inverter circuit 336 is likewise driven to the logic high state after a small delay introduced by the operation of inverters 334 and 336. The transition to logic high is the trailing edge 46 of the SAEN pulse. The pulse width PW of the pulse for the SAEN signal (i.e., from leading edge 44 to trailing edge 46) is accordingly controlled by the propagation delays of the SAEN signal and VTRACK signal which depend on the RC delays of the horizontal SAEN signal and the vertical VTRACK signal over their respective U-turn signal lines. This ensures the automatic tuning of SAEN pulse width based on the horizontal RC delay which is proportional to length of SAEN signal line 200 and the vertical RC delay of the VTRACK signal which is proportional to length of global output lines 130.

Figure 7:
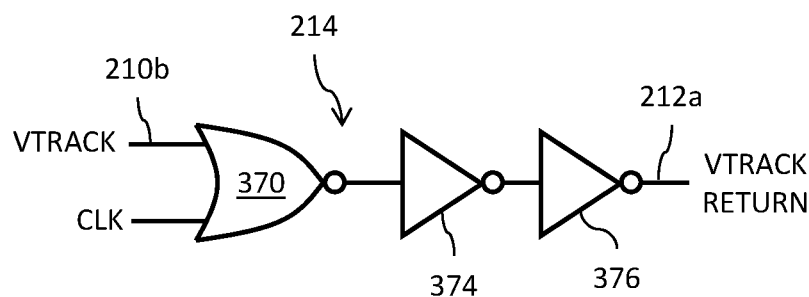
FIG. 7 is a circuit diagram for an alternative implementation of the driver circuit for the vertical tracking U-turn signal line.

Reference is now made to FIG. 7 which shows a circuit diagram for an alternative implementation of the second driver circuit 214 for the U-turn signal line associated with propagation of the VTRACK signal. The second driver circuit 214 includes a logical NOR gate 370 having a first input coupled to the second end 210*b* of the tracking signal line 210 and a second input coupled to receive a clock signal CLK. The clock signal CLK is the clock for timing the memory read operation. The logical NOR gate 342 generates a signal 372. The signal is passed through a pair of series connected inverters 374 and 376 to generate the VTRACK RETURN signal coupled to the first end 212*a* of the tracking signal return line 212.

Figure 8:
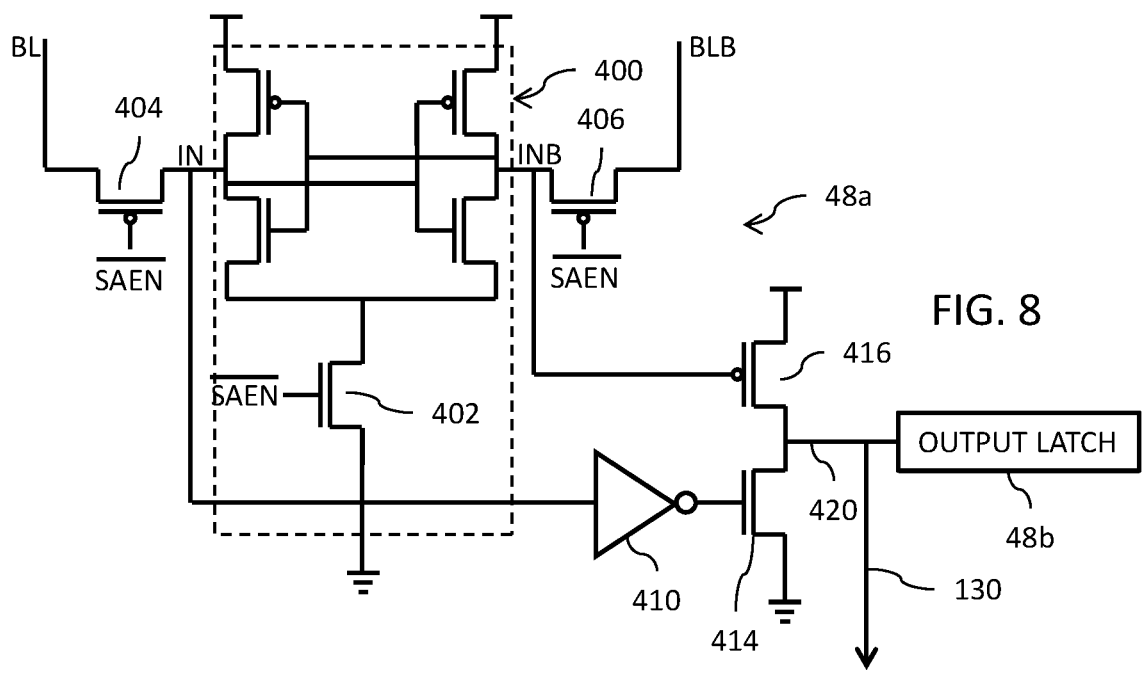
FIG. 8 is a circuit diagram of a sense amplifier circuit along with an attached output latch.

Reference is now made to FIG. 8 which shows a circuit diagram of the sense amplifier 48*a* and output latch 48*b*. The sense amplifier 48*a* includes latching circuit 400 having complementary internal nodes IN and INB and formed by cross-coupled CMOS inverter circuits. The latching circuit 400 includes a tail current source MOSFET 402 having a gate terminal driven by the logical inversion of the SAEN signal (SAEN bar). The internal node IN is coupled to the bit line BL through a pass gate MOSFET 404. The internal node INB is coupled to the bit line BLB through a pass gate MOSFET 406. The gate terminals of the transistors 404 and 406 are driven by the logical inversion of the SAEN signal (SAEN bar). The internal IN is coupled through an inverter 410 to the gate terminal of an n-channel MOSFET 414. The internal node INB is coupled to the gate terminal of a p-channel MOSFET 416. The transistors 414 and 416 have their source-drain paths coupled in series at node 420. The output latch circuit 48*b* is coupled to node 420 and the global output line 130 is also coupled to the node 420.

When SAEN is logic high, the latching circuit 400 is disabled from operation and the pass gate MOSFETs 404 and 406 are turned on to couple the voltage available on the bit lines BL/BLB to the internal nodes IN/INB. When SAEN then transitions to logic low, the latching circuit 400 is enabled for operation and the transistors 404 and 406 are turned off. The latching circuit 400 of the sense amplifier 48a resolves the voltage difference available between the nodes IN and INB and drives the output node 420 to the high or low logic state corresponding to the voltage from the bit lines BL/BLB. The voltage at the output node 420 then settles on the global output line 130 and is latched in the output latch 48b.

In an embodiment, the size of the transistors included in the final driver of second driver circuit 214 are sized to correspond to the n-channel and p-channel MOSFETs 414 and 416 of the driver circuit for the sense amplifier 48 which drives the of the global output line 130. This is preferred in order to mimic the actual behavior of the signal on the global output lines, so that an exactly similar load in terms of RC delay is seen by the final driver of circuit 214. Consequently, this ensures that any variation in the output global lines 130 will produce a proportional shift in SAEN pulse width.

With reference once again to FIG. 4 and the first driver circuit 204, it will be noted that included logic inverters which generate the SAEN RETURN signal from the SAEN signal are provided so that a fast transition of the logic state of the SAEN RETURN signal is made. The reason for this is that the tracking of the horizontal RC delay of interest (i.e., the delay associated with the SAEN signal line 200 from end 200a to end 200b) is present at the input of circuit 204. The reverse path for the SAEN RETURN signal on SAEN return signal line 202 made as quick as possible using the drivers of the circuit 204. This obviates any need to tap the SAEN RETURN signal to address issues or concerns with speed.

The timing window of the SAEN pulse (i.e., the pulse width PW) depends largely on the RC delay (reference 220) of the SAEN/SAEN RETURN signals and RC delay of the VTRACK and VTRACK RETURN signals, which is proportional to the RC delay (reference 222) of the global output lines. The signal propagation lengths are dependent on the size of the memory. Thus, an advantage of use of the SAEN generator circuit 10' of FIG. 5 is that the solution automatically adjusts to the size of the memory within which it is used. The SAEN evaluation timing window is optimized to the memory size and process, voltage and temperature (PVT) spread.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
a plurality of sense amplifiers arranged in a row, wherein each sense amplifier is connected to a pair of bit lines and wherein each sense amplifier has an input coupled to a sense amplifier enable signal line that extends along the row from a first end on one end of the row of sense amplifiers to a second end on an opposite end of the row of sense amplifiers;
a sense amplifier enable signal return line that extends from a third end at the opposite end of the row of sense amplifiers to a fourth end at the one end of the row of sense amplifiers;
wherein the third end of the sense amplifier enable signal return line is coupled to the second end of the sense amplifier enable signal line;
a tracking circuit configured to determine that a sufficient voltage difference is present on the pair of bit lines for sensing by the sense amplifier and generate a tracking signal;
a tracking signal line that extends along a column from a first end to a second end, said tracking signal being applied to the first end of the tracking signal line;
a tracking signal return line that extends from a third end to a fourth end;
wherein the third end of the tracking signal return line is coupled to the second end of the tracking signal line;
a sense amplifier enable signal generator circuit configured to apply a sense amplifier enable signal, said sense amplifier enable signal having a pulse width between a leading edge and a trailing edge, to the first end of the sense amplifier enable signal line and receive a sense amplifier enable return signal at the fourth end of the sense amplifier enable signal return line and also receive a tracking return signal at the fourth end of the tracking signal return line, said sense amplifier enable return signal generated in response to the sense amplifier enable signal;
wherein timing of the leading edge of the pulse width is set by the sense amplifier enable signal generator circuit in response to generation of the tracking signal by the tracking circuit; and
wherein timing of the trailing edge of the pulse width is set by the sense amplifier enable signal generator circuit in response to a change in logic state of both said sense amplifier enable return signal and said tracking return signal.

2. The circuit of claim 1, wherein the third end of the sense amplifier enable signal return line is coupled to the second end of the sense amplifier enable signal line by a first driver circuit having an input connected to the second end of the sense amplifier enable signal line and an output connected to the third end of the sense amplifier enable signal return line.

3. The circuit of claim 1, wherein the sense amplifier enable signal return line extends parallel to the sense amplifier enable signal line.

4. The circuit of claim 1, wherein the sense amplifier enable signal generator circuit comprises a logic circuit configured to logically combine said sense amplifier enable return signal and said tracking return signal to generate a reset signal which controls said timing of the trailing edge of the pulse width.

5. The circuit of claim 4, wherein the logic circuit comprises:
a first logic gate configured to logically combine the sense amplifier enable return signal and a signal derived from the sense amplifier enable signal to generate a first logic signal;
a second logic gate configured to logically invert the first logic signal to generate a second logic signal; and
a third logic gate configured to logically combine the second logic signal and the tracking return signal to generate the reset signal.

6. The circuit of claim 1, further comprising:
an output circuit coupled to the plurality of sense amplifiers by a corresponding plurality of global output lines extending parallel to the column;

wherein the tracking signal line and the tracking signal return line extend parallel to the plurality of global output lines.

7. The circuit of claim 1, wherein the third end of the tracking signal return line is coupled to the second end of the tracking signal line by a second driver circuit having an input connected to the second end of the tracking signal line and an output connected to the third end of the tracking signal return line.

8. The circuit of claim 7, wherein the second driver circuit comprises a further logic circuit configured to logically combine the tracking signal at the second end of the tracking signal line with a clock signal to generate the tracking return signal at the third end of the tracking signal return line.

9. A circuit, comprising:
a first U-turn signal line extending parallel to rows of a memory array, said first U-turn signal line having an input configured to receive a sense amplifier enable signal and an output configured to output a sense amplifier enable return signal generated in response to the sense amplifier enable signal;
a plurality of sense amplifiers arranged in a row and having inputs connected to receive the sense amplifier enable signal from the first U-turn signal line;
a second U-turn signal line extending parallel to columns of the memory array, said second U-turn signal line having an input configured to receive a tracking signal and an output configured to output a tracking return signal generated in response to the tracking signal;
a sense amplifier enable signal generator circuit configured to generate both the sense amplifier enable signal and the tracking signal, the sense amplifier enable signal having a pulse width between a leading edge and a trailing edge; and
wherein timing of the trailing edge of the pulse width is set by a reset signal output by a logic circuit in response to a logical combination of the sense amplifier enable return signal and the tracking return signal;
wherein the logic circuit comprises:
a first logic gate configured to logically combine the sense amplifier enable return signal and a signal derived from the sense amplifier enable signal to generate a first logic signal;
a second logic gate configured to logically invert the first logic signal to generate a second logic signal; and
a third logic gate configured to logically combine the second logic signal and the tracking return signal to generate the reset signal.

10. The circuit of claim 9, wherein:
the first U-turn signal line comprises a sense amplifier enable signal line that extends along the plurality of sense amplifiers arranged in the row in a first direction and a sense amplifier enable signal return line that extends along the plurality of sense amplifiers arranged in the row in a second direction opposite to the first direction; and
the second U-turn signal line comprises a tracking signal line that extends parallel to the column in a third direction and a tracking signal return line that extends in a fourth direction opposite to the third direction.

11. The circuit of claim 10, wherein:
the sense amplifier enable signal return line is coupled to the sense amplifier enable signal line by a first driver circuit that generates the sense amplifier enable return signal for propagation along the sense amplifier enable signal return line from the sense amplifier enable signal; and
the tracking signal return line is coupled to the tracking signal line by a second driver circuit that generates the tracking return signal for propagation along the tracking signal return line from the tracking signal.

12. The circuit of claim 10, further comprising:
an output circuit coupled to the plurality of sense amplifiers by a corresponding plurality of global output lines extending parallel to the columns;
wherein the tracking signal line and the tracking signal return line extend parallel to the plurality of global output lines.

13. A method, comprising:
generating a tracking signal in response to determining that a sufficient voltage difference has developed across bit lines of a memory;
generating a sense amplifier signal, wherein the sense amplifier enable signal has a pulse width between a leading edge and a trailing edge, and wherein the leading edge of the sense amplifier signal is generated in response to the tracking signal;
propagating the sense amplifier enable signal through a first U-turn signal line extending parallel to rows of the memory array and coupled to a plurality of sense amplifiers arranged in a row to generate a sense amplifier enable return signal;
propagating the tracking signal through a second U-turn signal line extending parallel to columns of the memory array to generate a tracking return signal;
logically combining the sense amplifier enable return signal and the tracking return signal to generate a reset signal; and
controlling timing of the trailing edge of the pulse width in response to said reset signal.

14. A circuit, comprising:
a sense amplifier having an input coupled to a sense amplifier enable signal line, wherein the sense amplifier is connected to a pair of bit lines extending along a column;
a tracking circuit configured to determine that a sufficient voltage difference is present on the pair of bit lines for sensing by the sense amplifier and in response thereto generate a tracking signal;
a tracking signal line that extends along the column from a first end to a second end, said tracking signal being applied to the first end of the tracking signal line;
a tracking signal return line that extends from a third end to a fourth end;
wherein the third end of the tracking signal return line is coupled to the second end of the tracking signal line;
a sense amplifier enable signal generator circuit configured to apply a sense amplifier enable signal to the sense amplifier enable signal line, said sense amplifier enable signal having a pulse width between a leading edge and a trailing edge, and wherein timing of the leading edge of the pulse width is set in response to said tracking signal, and receive a tracking return signal at the fourth end of the tracking signal return line, said tracking return signal generated in response to the tracking signal; and
wherein timing of the trailing edge of the pulse width is set by the sense amplifier enable signal generator circuit in response to a change in logic state of said tracking return signal.

15. The circuit of claim 14, wherein the sense amplifier enable signal generator circuit comprises a logic circuit configured to logically combine said tracking return signal with an enable signal generated in response to said sense amplifier enable signal.

16. The circuit of claim 15, wherein the logic circuit comprises:
- a first logic gate configured to logically combine a sense amplifier enable return signal and said enable to generate a first logic signal;
- a second logic gate configured to logically invert the first logic signal to generate a second logic signal; and
- a third logic gate configured to logically combine the second logic signal and the tracking return signal to generate a reset signal which triggers setting the trailing edge of the pulse width.

17. The circuit of claim 16, wherein the sense amplifier enable signal line extends along a row from a first end to a second end, the first end configured to receive the sense amplifier enable signal, and further comprising:
- a sense amplifier enable signal return line that extends from a third end to a fourth end;
- wherein the third end of the sense amplifier enable signal return line is coupled to the second end of the sense amplifier enable signal line; and
- wherein the sense amplifier enable return signal is generated at the fourth end.

18. The circuit of claim 14, further comprising:
- an output circuit coupled to the sense amplifier by a global output line extending parallel to the column;
- wherein the tracking signal line and the tracking signal return line extend parallel to the global output line.

19. The circuit of claim 14, wherein the third end of the tracking signal return line is coupled to the second end of the tracking signal line by a second driver circuit having an input connected to the second end of the tracking signal line and an output connected to the third end of the tracking signal return line.

20. The circuit of claim 19, wherein the second driver circuit comprises a further logic circuit configured to logically combine the tracking signal at the second end of the tracking signal line with a clock signal to generate the tracking return signal at the third end of the tracking signal return line.

* * * * *